(12) United States Patent
Tagawa et al.

(10) Patent No.: US 7,728,515 B2
(45) Date of Patent: Jun. 1, 2010

(54) LIGHT-EMITTING CIRCUIT BOARD AND LIGHT-EMITTING DISPLAY DEVICE

(75) Inventors: Akira Tagawa, Nara (JP); Noboru Noguchi, Nara (JP)

(73) Assignee: Sharp Kabushiki Kaisha, Osaka (JP)

(*) Notice: Subject to any disclaimer, the term of this patent is extended or adjusted under 35 U.S.C. 154(b) by 252 days.

(21) Appl. No.: 11/915,174

(22) PCT Filed: Jan. 26, 2006

(86) PCT No.: PCT/JP2006/301232
§ 371 (c)(1),
(2), (4) Date: Nov. 21, 2007

(87) PCT Pub. No.: WO2006/126304
PCT Pub. Date: Nov. 30, 2006

(65) Prior Publication Data
US 2009/0045724 A1    Feb. 19, 2009

(30) Foreign Application Priority Data
May 25, 2005    (JP) .............................. 2005-152953

(51) Int. Cl.
*H01J 1/62*    (2006.01)
*H01J 63/04*   (2006.01)
(52) U.S. Cl. .................. 313/504; 313/498; 313/506; 313/512
(58) Field of Classification Search .......... 313/498–512
See application file for complete search history.

(56) References Cited

U.S. PATENT DOCUMENTS

| | | | |
|---|---|---|---|
| 6,380,687 B1 | 4/2002 | Yamazaki | |
| 6,552,496 B2 | 4/2003 | Yamazaki | |
| 6,690,110 B1 | 2/2004 | Yamada et al. | |
| 6,714,178 B2 | 3/2004 | Koyama et al. | |
| 6,774,573 B2 | 8/2004 | Yamazaki | |

(Continued)

FOREIGN PATENT DOCUMENTS

JP    2001-109398 A    4/2001

(Continued)

OTHER PUBLICATIONS

Official communication issued in the International Application No. PCT/JP2006/301232, mailed on Apr. 18, 2006.

*Primary Examiner*—Joseph L Williams
*Assistant Examiner*—Kevin Quarterman
(74) *Attorney, Agent, or Firm*—Keating & Bennett, LLP (57) ABSTRACT

The present invention provides a light-emitting circuit board and a light-emitting display device, which can reduce a frame region (a space between a side of the board and a pixel region) on a board. The light-emitting circuit board of the present invention is a light-emitting circuit board comprising: on a board, a plurality of pixels each including a first electrode, a light-emitting layer, and a second electrode, stacked in this order; a driver circuit; and an external terminal, wherein the driver circuit is connected to the external terminal; the second electrode of the pixel and the external terminal are connected to each other by a wiring through an off-pixel contact; and the wiring is disposed to overlap with at least part of the driver circuit.

8 Claims, 6 Drawing Sheets

U.S. PATENT DOCUMENTS

| | | |
|---|---|---|
| 6,788,278 B2 | 9/2004 | Aoki |
| 6,911,960 B1 | 6/2005 | Yokoyama |
| 6,965,363 B2 | 11/2005 | Sato et al. |
| 7,148,630 B2 | 12/2006 | Koyama et al. |
| 7,256,422 B2 | 8/2007 | Yamazaki |
| 2005/0200270 A1* | 9/2005 | Kwak et al. ................ 313/502 |
| 2006/0055643 A1 | 3/2006 | Sato et al. |
| 2007/0080917 A1 | 4/2007 | Koyama et al. |
| 2007/0120473 A1* | 5/2007 | Nakamura et al. .......... 313/506 |

FOREIGN PATENT DOCUMENTS

JP        2004-127551 A        4/2004

* cited by examiner

LIGHT-EMITTING CIRCUIT BOARD AND LIGHT-EMITTING DISPLAY DEVICE

BACKGROUND OF THE INVENTION

1. Field of the Invention

The present invention relates to light-emitting circuit boards and light-emitting display devices. More specifically, the present invention relates to a light-emitting circuit board and a light-emitting display device, which is preferably used in active matrix electroluminescent display devices.

2. Description of the Related Art

With diversification of information processing devices, demands for flat display elements which consume electric power lower than that of a commonly used cathode ray tubes (CRT) and which can be thinned have been increasing, recently. Examples of such flat display elements include a liquid crystal display element and an electroluminescent element (hereinafter, also referred to as "EL element"). Particularly for organic EL elements, research and development have been actively carried out because such organic EL elements have characteristics such as driving at low voltages, all-solid state, high responsiveness, and self-emitting property.

The organic EL elements are broadly classified into passive matrix type (PM type) and active matrix type (AM type) (for example, refer to Japanese Kokai Publication No. 2000-173779 and Japanese Kokai Publication No. 2002-32037). The passive matrix organic EL elements are driven by a line sequential driving method, and light is emitted only from pixels whose scanning electrodes are selected. Therefore, a display capacity is increased in order to obtain a high luminance. That is, a large instantaneous electric power needs to be applied to each pixel, with an increase in the number of scanning electrodes. Accordingly, the PM organic EL elements have room for improvement in that the power consumption is large and in that the product lifetime is short because deterioration of the light-emitting layer, attributed to application of a large electric power, is significant.

In the AM organic EL elements, an active element is formed inside each pixel, and particularly, a system in which a thin film transistor (TFT) is formed in each pixel has been widely used. According to the AM organic EL elements, for example, in a system in which a TFT is formed inside each pixel, switching can be performed in every pixel. Therefore, according to the AM organic EL elements, the number of the scanning electrodes is not limited in principle and display during almost 100% of one frame period can be performed. Further, the instantaneous electric power can be more suppressed in comparison to the PM organic EL elements. Therefore, such AM organic EL elements permit high luminance, high image quality, and large-capacity display. Further, according to the AM organic EL elements, there is no need to apply a large electric power to each pixel in order to obtain a high luminance, unlike the PM organic EL elements. Therefore, a lower driving voltage and a longer product lifetime are permitted. Therefore, research and development especially for the AM organic EL elements have been actively carried out, recently.

Figure 4:
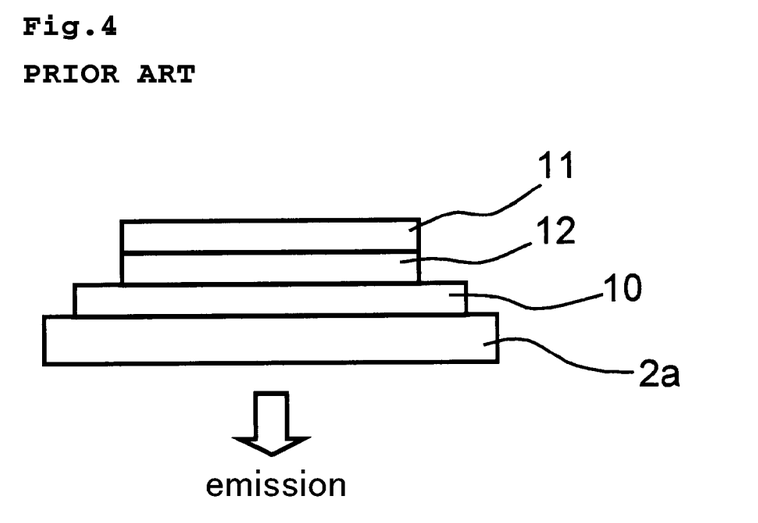
FIG. 4 is a cross-sectional view schematically showing a conventional bottom emission organic EL element.

FIG. 4 is a cross-sectional view schematically showing a conventional bottom emission organic EL element. The organic EL element includes a board 2a, a light-emitting organic layer 12 formed on the board 2a, and a first electrode 10 and a second electrode 11 arranged to interpose the light-emitting organic layer 12 therebetween. The first electrode 10 has a function of injecting holes into the light-emitting organic layer 12. The second electrode 12 has a function of injecting electrons into the light-emitting organic layer 12. The holes and the electrons, injected from the first electrode 10 and the second electrode 11, respectively, recombine in the light-emitting organic layer 12, and thereby the light-emitting organic layer 12 emits light. The board 2a and the first electrode 10 are configured to have a light-transmitting property. The second electrode 11 is configured to have a light-reflecting property. Light emitted from the light-emitting organic layer 12 is transmitted through the first electrode 10 and the board 2 to be output from the organic EL element.

Figure 5:
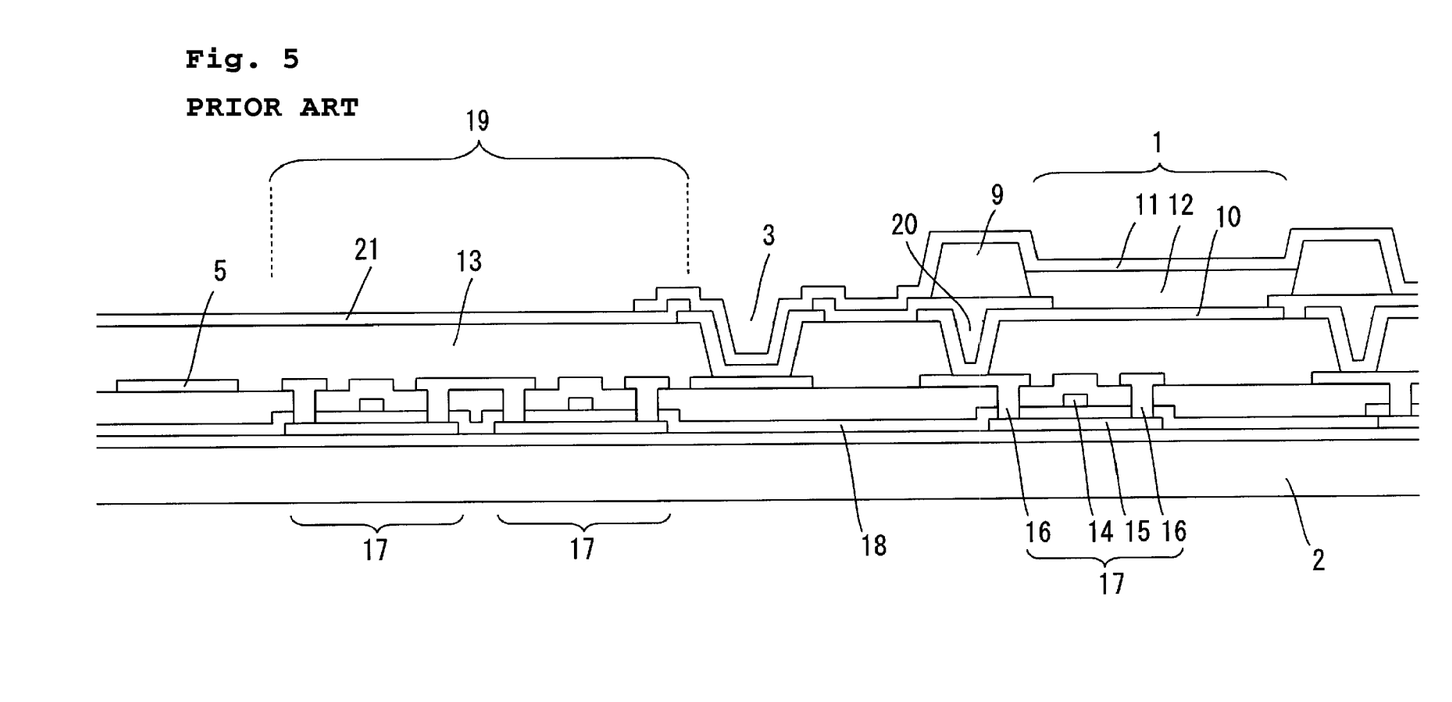
FIG. 5 is a cross-sectional view schematically showing one example of a conventional active matrix organic EL display device.

If the organic EL element is driven by the active matrix (AM) system, an active matrix (AM) board including TFTs and electrodes is used as a board. FIG. 5 is a cross-sectional view schematically showing one example of a conventional AM organic EL display. As shown in FIG. 5, according to a conventional AM organic EL display, a TFT 17 for driving each pixel, a first electrode 10, a second electrode 11, a flattening film 13, and the like, are formed on a board 2.

The TFT 17 includes: an island semiconductor layer 15; a gate insulator 18 formed thereon; a gate electrode 14 insulated from the island semiconductor layer 15 by the gate insulator 18; and source/drain electrodes 16 which are formed on the island and semiconductor layer 15 and are connected to source/drain regions of the TFT 17.

The first electrode 10 is formed at a plurality of positions on the board 2 in a matrix pattern. The plurality of the first electrodes 10 constitutes pixel regions 1 of the organic EL element, respectively. An insulating film 21 is formed on the first electrodes 10 and provided with an opening only at a light-emitting portion. Each of the first electrodes 10 is connected to the source/drain electrodes 16 of the TFT 17 through an in-pixel contact 20 formed in the flattening film 13, and has a function of injecting holes into the light-emitting layer 12 in accordance with a signal input from the TFT 17.

The second electrode 11 is formed to cover the light-emitting organic layer 12 and a barrier insulating layer 9 and has a function of injecting electrons into the light-emitting organic layer 12. The second electrode 11 is connected to the source/drain electrodes 16 formed in the AM board through an off-pixel contact 3. The source/drain electrodes 16 are formed in the same layer as a layer where a wiring 5 for connecting the in-pixel contact 20 to a terminal for supplying an electric signal and/or an electric power from an external circuit to the AM board is formed.

Figure 6:
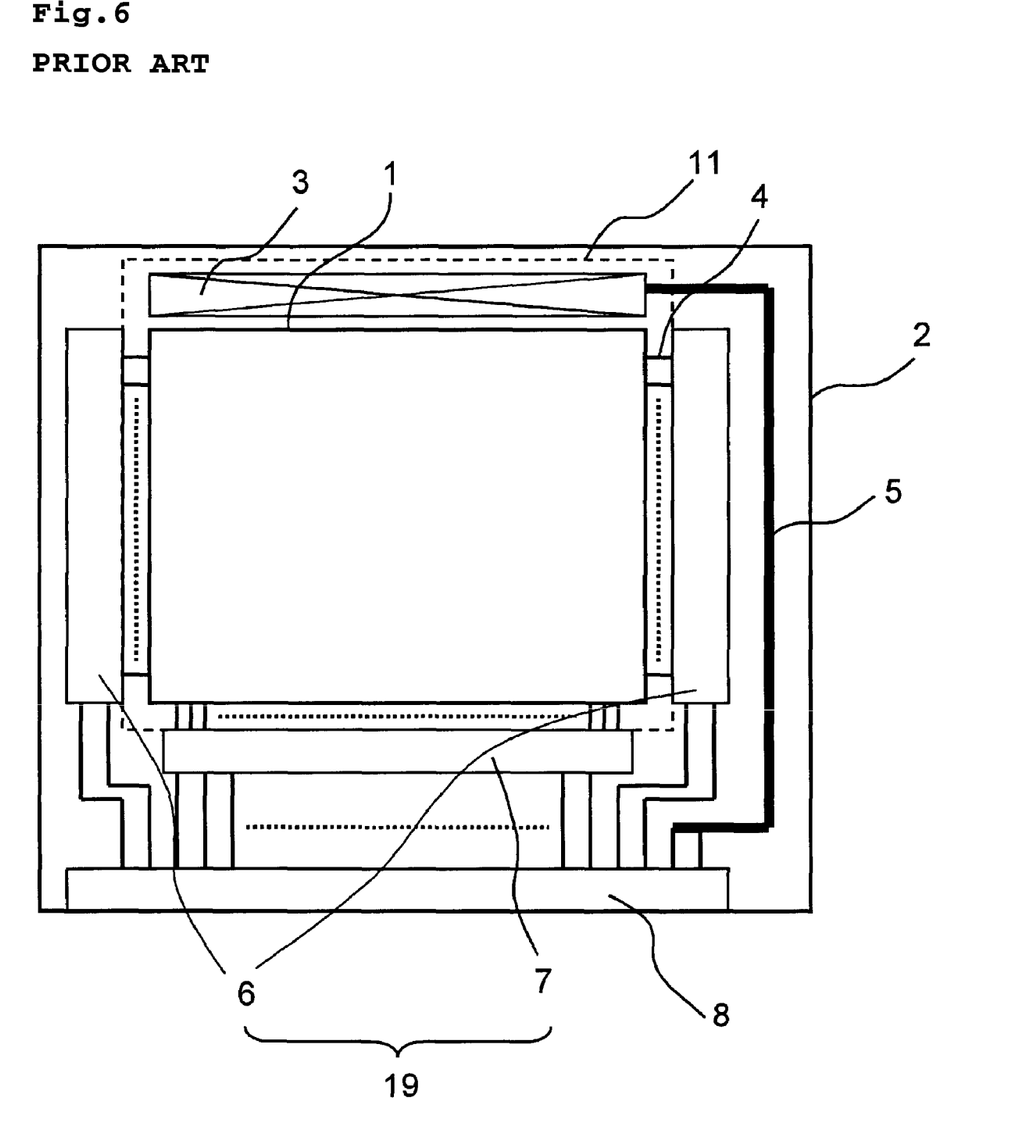
FIG. 6 is a planar view schematically showing a conventional organic EL display device.

FIG. 6 is a planar view schematically showing one example of a conventional AM organic EL display.

As shown in FIG. 6, according to a conventional AM organic EL display, a pixel region 1 where a thin film transistor, a first electrode, a light-emitting layer, and a second electrode are stacked on an AM board in this order is formed. In addition, a signal line 4 for connecting a driver circuit 19 including the thin film transistor (containing a source driver circuit 7 and a gate driver circuit 6) to a pixel, a wiring 5 connected to the second electrode through an off-pixel contact 3, and an external terminal 8 connected to the driver circuit 19 and the wiring 5, are formed. An electric signal and/or an electric power supplied from an external circuit pass/passes through the external terminal 8 into the driver circuit 19.

According to the AM organic EL displays, TFTs and electrodes, which are made of silicon with a low light transmittance, need to be formed on the board. Accordingly, the AM organic EL elements have room for improvement in that a ratio of a light-emitting area to a pixel area (opening ratio) is small. Particularly in organic EL elements driven by a current driving system in which variation of display among pixels can be prevented and decrease in display performances, attributed to deterioration of a light-emitting material, can be effectively suppressed, much more TFTs need to be formed inside each pixel, in comparison to the organic EL elements driven by a voltage driving system. Therefore, the organic EL elements in the current driving system have room for improvement in that the opening ratio is further reduced.

For this problem, a top emission organic EL element, in which the second electrode is made of a light-transmitting material and the first electrode is made of a light-reflecting material, and thereby light emitted from the light-emitting organic layer is output not from the first electrode side that is a side of the board where TFTs and electrodes not transmitting light are formed but from the second electrode side, was proposed (for example, refer to Japanese Kokai Publication No. 2004-127551).

According to the top emission organic EL elements, light emitted from the light-emitting organic layer can be output not through the board where TFTs and electrodes not transmitting light are formed. Therefore, the opening ratio can be larger than that of the bottom emission organic EL elements, and thereby organic EL elements with a higher luminance can be provided.

According to the top emission organic EL elements, light emitted from the light-emitting layer is output from the second electrode side, and therefore the second electrode is made of a material with a high light transmittance. Examples of such a material for the second electrode include indium tin oxide (ITO) and indium zinc oxide (IZO). However, electrode materials with a high light transmittance such as indium tin oxide (ITO) have a higher electric resistance than that of metal materials such as silver (Ag) and aluminum (Al), which have been conventionally used as a material for the second electrode. Therefore, the second electrode made of indium tin oxide (ITO) and the like, having a high light transmittance, has a high electric resistance. If the second electrode has a high resistance, voltage reduction occurs at part of the second electrode. Accordingly, the organic EL elements including the second electrodes made of indium tin oxide (ITO) and the like, having a high electric resistance, have room for improvement in that a voltage is not uniformly applied to the second electrode and therefore, uneven image is displayed. In addition, the top emission organic EL elements have room for improvement in that the driving voltage is high because the second electrode has a high electric resistance.

For this problem, a configuration in which a part electrically connecting the second electrode to a substrate-side wiring (off-pixel contact) is formed at a plurality of positions, for example, at four corners of a pixel region was proposed, as a measure for suppressing the voltage reduction generated in the second electrode, thereby uniformly applying a voltage to the second electrode (for example, refer to Japanese Kokai Publication No. 2001-109395). According to this, the voltage reduction generated in the second electrode can be suppressed, in comparison to the case where one off-pixel contact is formed. As a result, a voltage can be uniformly applied to the second electrode.

Figure 7:
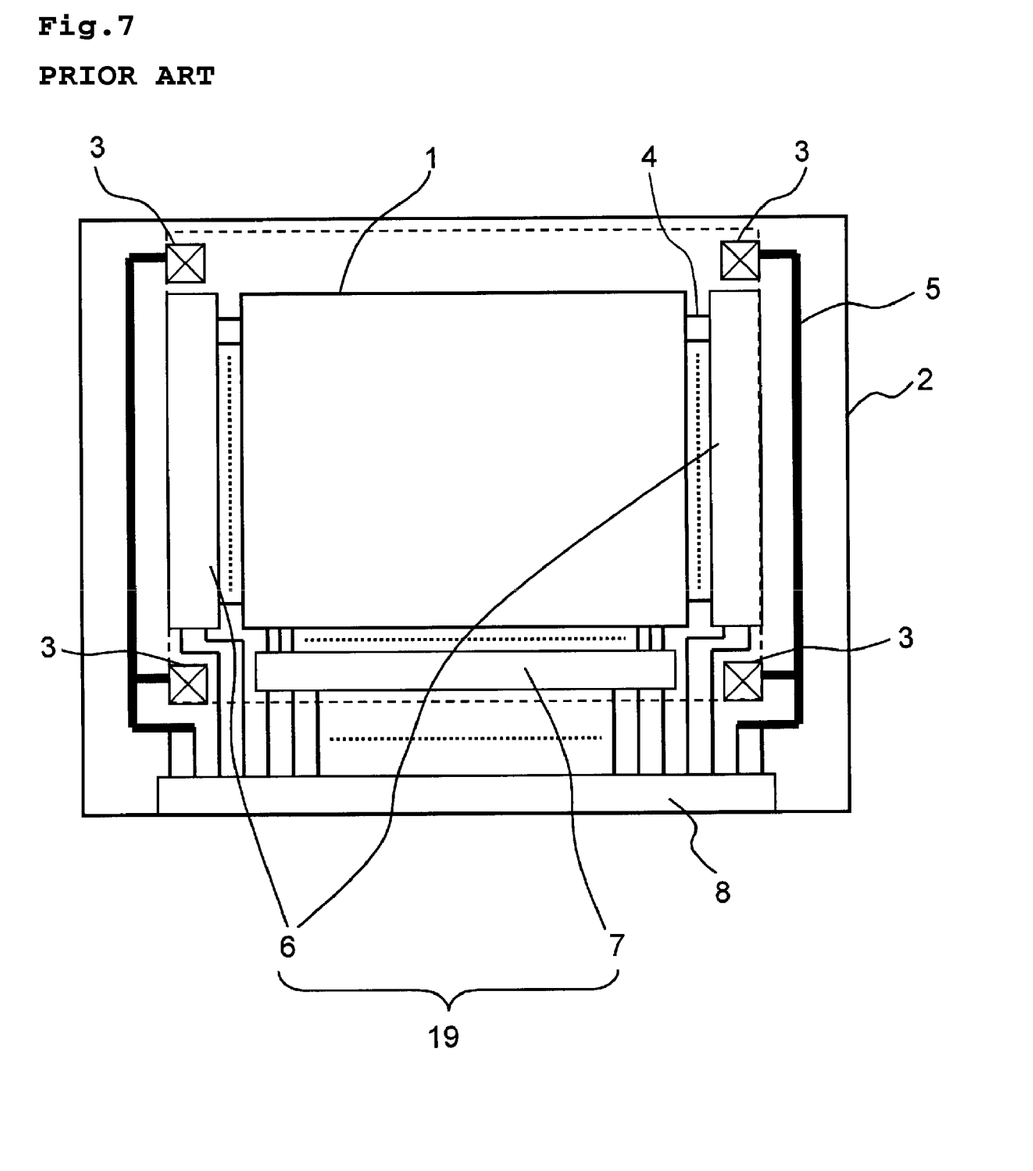
FIG. 7 is a planar view schematically showing a conventional organic EL display device.

However, the number of the wiring for connecting the off-pixel contact to the external terminal is increased, with the increase in the number of the off-pixel contact. As a result, as shown in FIG. 7, a space where a wiring 5 for connecting each off-pixel contact 3 to an external terminal 8 is formed is needed, and therefore a frame region (a space between a side of the board and a pixel region) is extended. In this point, there is room for improvement.

SUMMARY OF THE INVENTION

In order to overcome the problems described above, preferred embodiments of the present invention provide a light-emitting circuit board and a light-emitting display device, which can reduce a frame region (a space between a side of the board and a pixel region) on a board.

The present inventors made various investigations regarding a light-emitting circuit board including: on a board, a plurality of pixels each including a first electrode, a light-emitting layer, and a second electrode, stacked in this order; a driver circuit; and an external terminal, wherein the second electrode of each pixel and the external terminal are connected to each other by a wiring through an off-pixel contact. The inventors noted the position where the above-mentioned wiring is formed. Then, the inventors discovered that if the above-mentioned wiring is formed to overlap with a driver circuit positioned in a frame region (a space between a side of the board and a pixel region) on the board, the frame region can be reduced. As a result, the above-mentioned problems have been solved, leading to completion of various preferred embodiments of the present invention.

That is, according to a preferred embodiment of the present invention, a light-emitting circuit board includes: on a board, a plurality of pixels each including a first electrode, a light-emitting layer, and a second electrode, stacked in this order; a driver circuit; and an external terminal, wherein the driver circuit is connected to the external terminal; the second electrode of each pixel and the external terminal are connected to each other by a wiring through an off-pixel contact; and the wiring is arranged to overlap with at least a portion of the driver circuit.

The pixel on the light-emitting circuit board of a preferred embodiment of the present invention essentially includes the first electrode, the light-emitting layer, and the second electrode, and these components are stacked on the board in this order. It is preferable that the above-mentioned first electrode functions as an anode electrode of an organic EL element. The above-mentioned light-emitting layer is a layer including an inorganic material or an organic material which emits light by applying an electrical field between the first electrode and the second electrode. Such a light-emitting layer is formed on the first electrode. The light-emitting layer may have a single layer structure including one layer, or may have a multilayer structure including two or more layers. In various preferred embodiments of the present invention, it is sufficient that at least the light-emitting layer is arranged between the first electrode and the second electrode, and a hole injection layer, a hole transport layer, an electron transport layer, and the like, may be disposed therebetween. It is preferable that the above-mentioned second electrode is arranged to cover a plurality of the light-emitting layers. The above-mentioned driver circuit has a function of outputting electric signals for controlling an emission state of pixels into the pixels. The above-mentioned external terminal has a function of receiving an electric signal and/or an electric power supplied for the driver circuit and the second electrode of the pixel, from the external circuit. A thin film transistor array board used in organic electroluminescent display devices may be used as the light-emitting circuit board, for example. The off-pixel contact is an element located in a region other than the pixel region that electrically connects the second electrode to the wiring that is connected to the external terminal.

Various preferred embodiments of the light-emitting circuit board of the present invention are described in more detail below.

It is preferable that the second electrode is made of a light-transmitting material. According to this, light emitted from the light-emitting layer can be output not from the first electrode side where the thin film transistors (TFTs) and the electrodes, not transmitting light, are formed, but from the second electrode side (top emission system). According to such top emission organic EL elements, emitted light can be output not through the board where the TFTs and the electrodes, not transmitting light, are formed, and therefore the opening ratio can be larger than that in the bottom emission organic EL elements. In the top emission organic EL elements, it is preferable that the first electrode is made of a light-reflecting material.

It is preferable that the wiring is formed in a layer including the first electrode. According to preferred embodiments of the present invention, the layer where the wiring is formed does not necessarily need to be formed in the same layer as a layer where the first electrode is formed, but this configuration is suitable for forming the wiring to overlap with the driver circuit. Accordingly, such a configuration can more effectively reduce the frame region (the space between the side of the board and the pixel region) than a conventional configuration in which the wiring is formed on the board so as not to overlap with the driver circuit. The above-mentioned wiring electrically connects the off-pixel contact to the external terminal.

It is preferable that each of the driver circuit and the pixel includes a thin film transistor including a gate electrode constituted by a first conductive layer, and source and drain electrodes constituted by a second conductive layer. Thin film transistors are classified into those in which the gate electrode (the first conductive layer) is formed above the source and drain electrodes (the second conductive layer) (top gate structure) and those in which the gate electrode is formed below them (bottom gate structure), whichever may be used. It is preferable that a signal line for connecting the thin film transistor inside the pixel to the driver circuit is constituted by the first conductive layer and/or the second conductive layer, and the wiring is constituted by a third conductive layer. The first conductive layer is a layer where the gate electrode is formed; the second conductive layer is a layer where the source and drain electrodes are formed; the third conductive layer is a layer where the above-mentioned wiring is formed. The first, second, and third conductive layers are preferably separate layers. Therefore, the third conductive layer is different from the first and second conductive layers constituting the gate electrode, the source electrode, and the drain electrode of the TFT, and the wiring connecting the TFTs to each other. Therefore, the third conductive layer may not be short-circuited with the first or second conductive layer, and therefore the third conductive layer can be formed above the TFT. The first, second, and third conductive layers are configured to be stacked in order of the first, second, third conductive layers, or in order of the second, first, third conductive layers, from the bottom. That is, the third conductive layer is formed above the first conductive layer and the second conductive layer, and the second conductive layer is formed above or below the first conductive layer. However, other layers may be formed between each pair of the layers.

Further, it is more preferable that a signal line for connecting the source electrode of the thin film transistor to the driver circuit is constituted by the second conductive layer. According to this, the signal line for connecting the source electrode of the thin film transistor to the driver circuit can be formed simultaneously when the source electrode and the drain electrode in the pixel region are formed.

The above-mentioned off-pixel contact needs to be formed at least at one position on the board. It is particularly preferable that the off-pixel contact is formed at a plurality of positions on the board. In a top emission light-emitting circuit board, voltage reduction may be generated in the second electrode because indium tin oxide (ITO) or indium zinc oxide (IZO) having a high light transmittance and a high sheet resistance is often used for the second electrode. However, the voltage reduction generated in the second electrode can be prevented and a voltage can be uniformly applied to the second electrode if the off-pixel contact is formed at a plurality of positions on the board. For example, the off-pixel contact may be formed at positions corresponding to the four corners of the pixel region. Further, a relatively large off-pixel contact may be formed along the side of the pixel region. In this case, the off-pixel contacts may be formed along all of the four sides of the pixel region, or may be formed along any three, two or one side of the pixel region.

It is preferable that the light-emitting layer includes an organic electroluminescent material. According to this, the light-emitting circuit board according to various preferred embodiments of the present invention can be applied to organic electroluminescent panels and organic electroluminescent display devices.

The light-emitting circuit board according to various preferred embodiments of the present invention may or may not include other components as long as they essentially include the above components. The configuration thereof is not especially limited.

Another preferred embodiment of the present invention provides a light-emitting display device including the light-emitting circuit board. The light-emitting display device is not especially limited, and an organic electroluminescent display device and the like may be mentioned. According to the light-emitting display device of a preferred embodiment of the present invention, the frame region can be reduced, and therefore a light-emitting display device having a large display region can be provided.

According to the light-emitting circuit board according to various preferred embodiments of the present invention, the second electrode of the pixel and the external terminal are connected to each other by the wiring through the off-pixel contact. If the wiring is arranged to overlap with the driver circuit, the frame region (the space between the side of the board and the pixel region) of the light-emitting circuit board can be reduced, and thereby reduction in size of the light-emitting display device is permitted. In addition, the off-pixel contact can be located at a plurality of positions on the board without increase in the frame region, and therefore voltage reduction generated in the second electrode can be reduced. As a result, uniform image can be displayed with a high luminance.

Other features, elements, processes, steps, characteristics and advantages of the present invention will become more apparent from the following detailed description of preferred embodiments of the present invention with reference to the attached drawings.

DETAILED DESCRIPTION OF PREFERRED EMBODIMENTS

The present invention is described in more detail below with reference to preferred embodiments thereof, using drawings, but the present invention is not limited to only these preferred embodiments.

Figure 1:
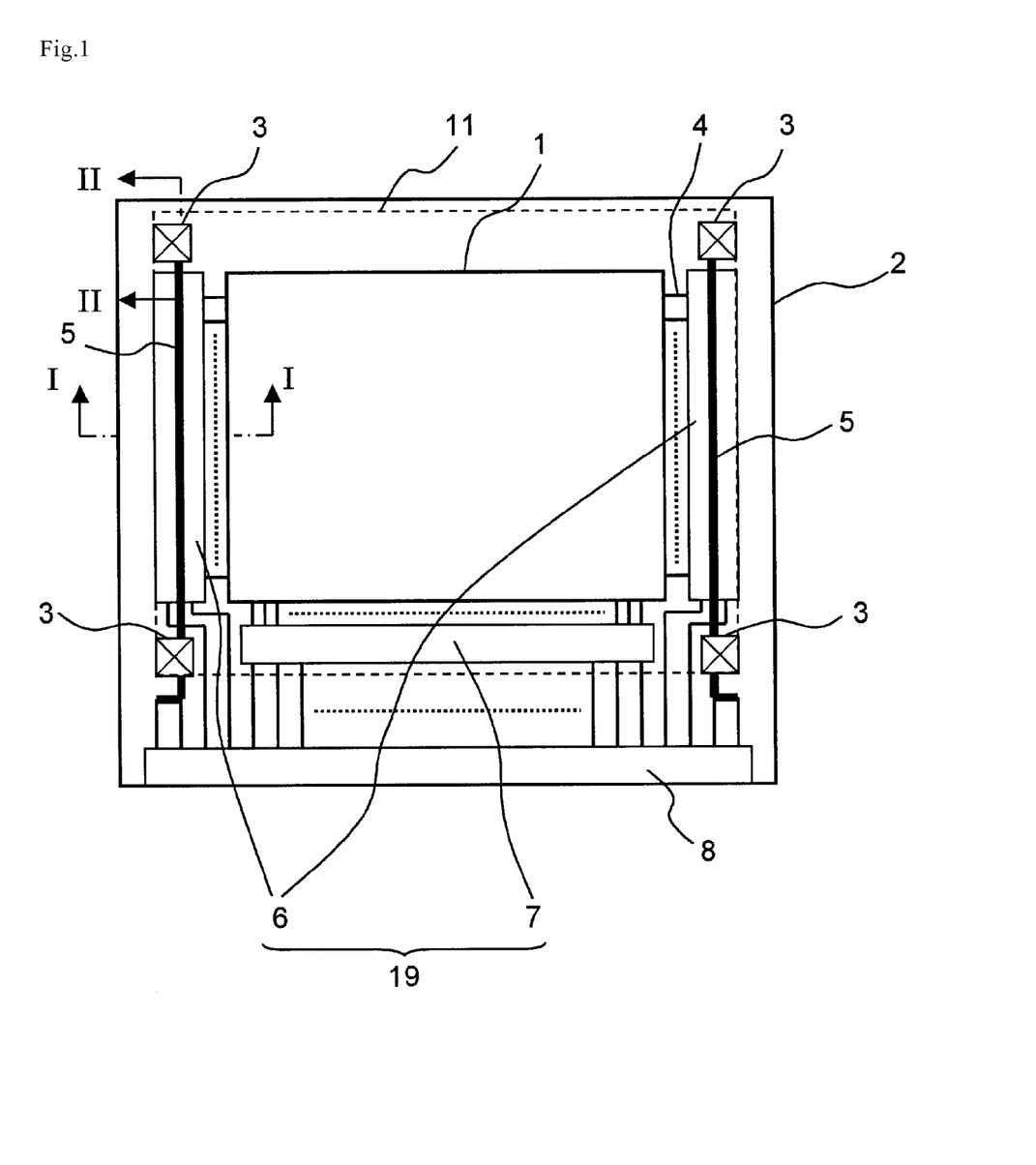
FIG. 1 is a planar view schematically showing an organic EL display device according to a preferred embodiment of the present invention.
Figure 2:
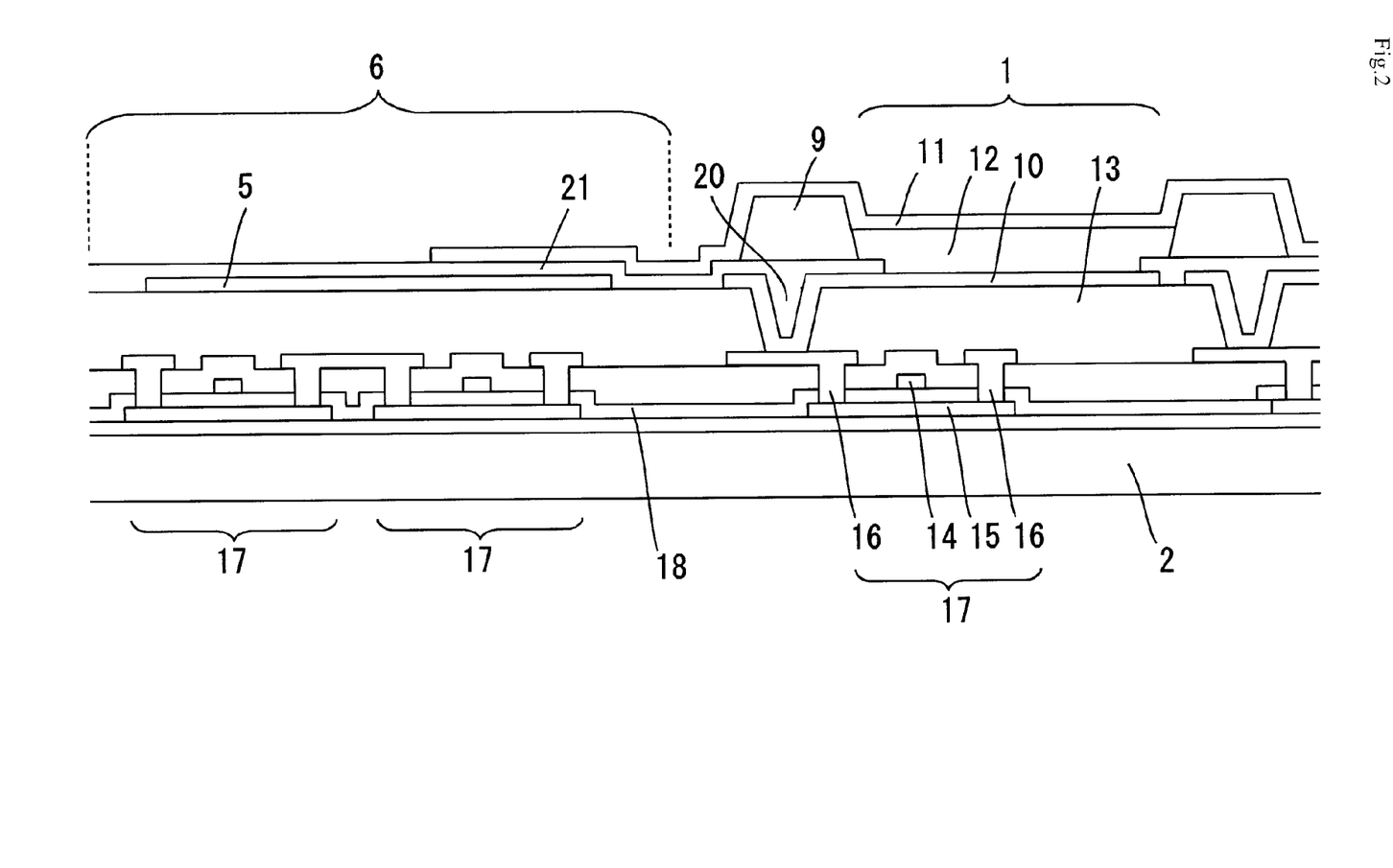
FIG. 2 is a cross-sectional view schematically showing the organic EL display device taken along line I-I in FIG. 1.
Figure 3:
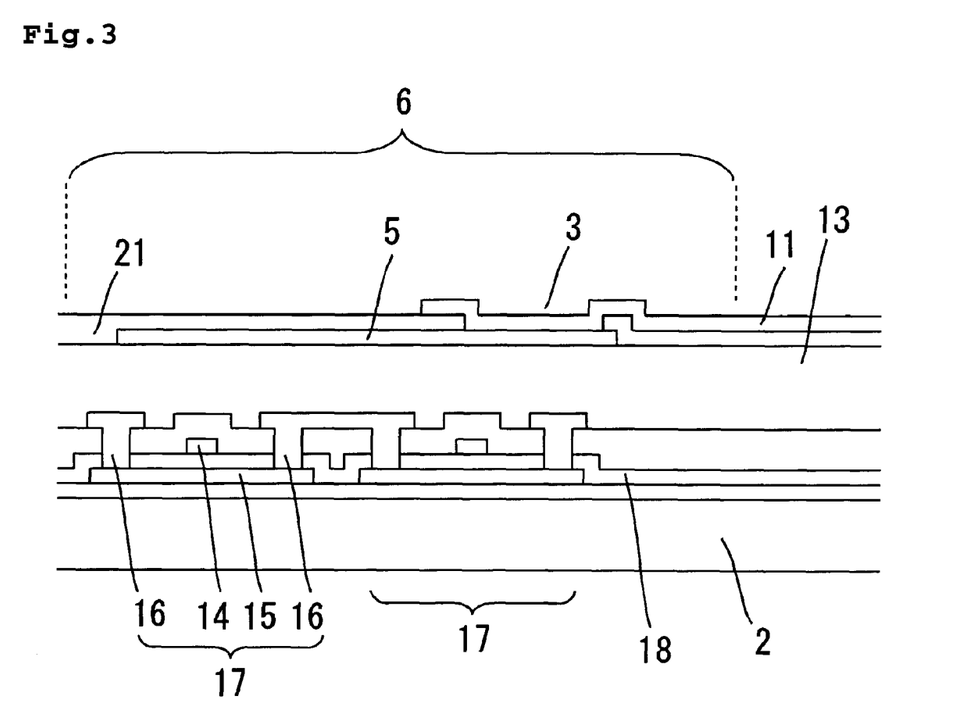
FIG. 3 is a cross-sectional view schematically showing the organic EL display device taken along line II-II in FIG. 1.

FIG. 1 is a planar view schematically showing an organic electroluminescent (organic EL) display device of the present invention. FIGS. 2 and 3 are cross-sectional views schematically showing the organic EL display device taken along lines I-I and II-II in FIG. 1, respectively.

As shown in FIG. 1, the organic EL display device according to a preferred embodiment of the present invention includes a pixel region 1 and a driver circuit 19 arranged to supply an electric signal for the pixel region 1 through a signal line 4. As shown in FIG. 2, the pixel region 1 includes, on an insulating board 2, a thin film transistor (TFT) 17, a first electrode 10 formed on the TFT 17 with a flattening film 13 therebetween, a barrier insulating layer 9 for partitioning the first electrode 10, a light-emitting organic layer 12 formed on the first electrode 10, and a second electrode 11 formed to cover the light-emitting organic layer 12. The TFT 17 includes a semiconductor layer 15 formed to have an island shape on the board 2, source/drain electrodes 16 connected to source/drain regions formed in the semiconductor layer 15, a gate electrode 14, and the like.

The organic EL display device in FIGS. 1 to 3 is a top emission organic EL display device in which light emitted from the light-emitting organic layer 12 is output from the second electrode 11 side. The top emission organic EL display device is described in the present preferred embodiment, but the present invention may be applied to bottom emission organic EL display device in which emitted light is output from the first electrode 10 side. In addition, according to the organic EL display device in the present preferred embodiment, the barrier insulating layer 9 for partitioning the first electrode 10 is formed because the light-emitting organic layer 12 is formed by an ink-jet method, but it is not limited to this configuration. That is, depending on the method of forming the light-emitting organic layer 12, the present invention may be applied to organic EL display devices having a configuration in which the barrier insulating layer 9 is formed to partition the first electrodes by two or more first electrodes; the barrier insulating layer 9 has a columnar shape; or the barrier insulating layer 9 is not formed.

The insulating board 2 is preferably made of an inorganic material, for example, quartz, glass such as soda glass, ceramics, or an organic material such as polyimide and polyester, but it is not especially limited as long as it is a board which can secure mechanical strength and has an insulating property. The TFT 17 has a top gate structure including the island semiconductor 15, a gate insulator 18 formed on the island semiconductor 15, the gate electrode 14 insulated from the island semiconductor 15 by the gate insulator 18, and the source/drain electrodes 16 connected to periphery of the island semiconductor 15. The TFT used in the present invention is not limited to such a TFT having the top gate structure. The materials for the gate insulator 18 and the like constituting the TFT 17 are not especially limited.

In the TFTs 17 included in the driver circuit 19 and the pixel region 1, the gate electrode 14 is constituted by a first conductive layer and the source/drain electrodes 16 are constituted by a second conductive layer. The materials for the first conductive layer and the second conductive layer are not especially limited. Examples of those materials include: electrode materials, such as metal materials with a high electrical conductivity such as silver (Ag), aluminum (Al), copper (Cu), tantalum (Ta), titanium (Ti), and chromium (Cr, and conductive oxides such as indium tin oxide (ITO) and indium zinc oxide (IZO); and stacking layers thereof.

The driver circuit 19 supplies an electrical signal for controlling light emission of pixels for the pixels. The driver circuit 19 preferably includes: on the board 2, a plurality of the TFTs 17; and a plurality of wirings which connect the TFTs to each other and which are constituted by the first conductive layer; and/or a plurality of wirings which are constituted by the second conductive layer. The driver circuit 19 includes a gate driver circuit 6 arranged to supply a scanning signal for the pixels and a source driver circuit 7 for supplying an image information signal for the pixels, as shown in FIG. 1. A portion of the gate driver circuit 6 and the source driver circuit 7 may be formed not on the board 2 but on an external circuit which is outside of the board 2. A signal line 4 for supplying an electric signal from the driver circuit 19 formed on the board 2 for the pixel region is constituted by the first conductive layer and/or the second conductive layer. For example, a scanning signal line from the gate driver circuit 6 is constituted by the first conductive layer which constitutes the gate electrode of the TFT 17, and a signal line from the source driver circuit 7 is constituted by the second conductive layer.

In the pixel region 1, the first electrodes 10 are formed on the TFT array board in a matrix pattern, and the plurality of the first electrodes 10 constitute each pixel region 1. The first electrode 10 is connected to the source electrode 16 through an in-pixel contact 20 formed in a flattening film 13, and has a function of injecting holes into the light-emitting organic layer 12 in accordance with signals input from the TFT 17.

The material for the first electrode 10 is not limited. Examples of such a material include electrode materials such as: metal materials such as silver (Ag) and aluminum (Al); and conductive oxides such as indium tin oxide (ITO) and indium zinc oxide (IZO). It is preferable that the first electrode 10 is made of a material with a high work function such as indium tin oxide (ITO) in order to increase an efficiency of injecting holes into the light-emitting organic layer 12. In addition, it is preferable that the first electrode 10 is made of a light-reflecting material such as silver (Ag) and aluminum (Al) in the top emission organic EL display device in which light emitted from the light-emitting organic layer 12 is output from the second electrode 11 side. Further, the first electrode 10 may be formed to have a multilayer structure including a metal layer made of aluminum (Al) and the like, having a high conductivity and a high light reflectance, and an electrode layer made of indium tin oxide (ITO) and the like, having a high work function. According to this configuration, the first electrode 10 can attain a high light reflectance and a high hole-injecting efficiency simultaneously, and therefore a top emission organic EL display device which permits a higher luminance can be provided. The shape of the plurality of the first electrodes 10 is not especially limited to a rectangular shape. A configuration in which an insulating film 21 is formed over the plurality of the first electrodes 10 and provided with an opening only at a light-emitting portion of each of the first electrodes 10 is preferable. As a result, electrical leakage at ends of the first electrode 10 or near the barrier insulating layer 9 can be prevented. The material for the insulating film 21 is not especially limited, and inorganic insulating films made of $SiO_2$ and the like may be mentioned.

It is more preferable that the first electrode 10 is formed and then the surface of the first electrode 10 is provided with lyophilicity by $UV/O_3$ (UV/ozone treatment) if the light-emitting organic layer 12 is formed by a wet-application method using an organic solvent, such as an ink-jet method and a spin-coating method. As a result, affinity between the first electrode 10 and the light-emitting organic layer 12 is improved, and thereby a more uniform light-emitting organic layer 12 can be formed. As a result, an organic EL display device which provides excellent display quality can be provided.

If the light-emitting organic layer 12 is formed by an ink-jet method, the barrier insulating layers 9 are formed in a lattice pattern at every two or more first electrodes 10, for partition. The material for the barrier insulating layer 9 is not limited, but it is preferably made of a material which hardly changes the shape, the characteristics, and the like, when heated. Examples of the material for the barrier insulating layer 9 include photosensitive polyimide, acrylic resin, methacrylic resin, and novolac resin. It is preferable that a photosensitive resin is used for the barrier insulating layer 9. This is because the barrier insulating layer 9 can be easily patterned by a photolithography step, without etching and stripping resists if a photosensitive material is used as the material for the barrier insulating layer 9.

It is preferable that the barrier insulating layer 9 is made of a lyophobic material if the light-emitting organic layer 12 is formed by a wet-application method using an organic solvent such as an ink-jet method and a spin-coating method. According to this configuration, even if the light-emitting organic layer 12 is formed by an ink-jet method, for example, an ink injected from an ink-jet nozzle does not adhere to the barrier insulating layer 9 and a uniform light-emitting organic layer 12 can be formed. In addition, according to this configuration, even if a position where an ink droplet ejected from an ink-jet nozzle is landed is shifted and the ink droplet drops on a slope surface of the barrier insulating layer, the ink droplet slips the slope surface and can form the light-emitting organic layer 12 at a desired position where the droplet is added. Examples of the lyophobic material for the barrier insulating layer 9 include materials prepared by doping fluorine or silicon additives into organic materials such as polyimide and acrylic resin. The same effects can be obtained even if the barrier insulating layer 9 is formed and then provided with lyophobicity. The method of providing the lyophobicity for the barrier insulating layer 9 is not limited, but a plasma treatment using oxygen or carbon tetrafluoride may be used, for example.

The light-emitting organic layer 12 is formed on each of the first electrodes 10 which are partitioned by the barrier insulating layers 9 formed in a lattice pattern, and includes a hole transport layer and a light-emitting layer. In the present invention, the light-emitting organic layer 12 is not limited to this configuration, and may include only a light-emitting layer. The light-emitting organic layer 12 may include any one or more layers of a light-emitting layer, a hole injection layer, a hole transport layer, an electron transport layer, and an electron injection layer. The hole transport layer has a function of transporting holes injected from the first electrode 10 to the light-emitting layer 12.

The material for the hole transport layer is not especially limited, and materials having a high hole-transporting efficiency are preferable. Examples of materials which have a high hole-transporting efficiency and are suitable for the hole transport layer include: low-molecular materials such as porphyrin compounds, aromatic tertiary amine compounds such as N,N'-bis-(3-methylphenyl)-N,N'-bis-(phenyl)-benzidine (TPD), and N,N'-di(naphthalene-1-yl)-N,N'-diphenyl-benzidine (NPD), hydrazone compounds, quinacridone compounds, and styrylamine compounds; polymer materials such as polyaniline, 3,4-polyethylenedioxythiophene/polystyrene sulfonate (PEDT/PSS), poly(triphenylamine derivative), and polyvinyl carbazole (PVCz); and polymer precursors such as poly(p-phenylene vinylene) precursor and poly(p-naphthalene vinylene) precursor. The hole transport layer is not limited to a single layer structure, and may have a multilayer structure. The hole injection layer may be formed between the hole transport layer and the light-emitting layer. According to this configuration, the efficiency of injecting holes into the light-emitting layer can be more increased, and therefore an organic EL display device which permits a high luminance can be provided.

The light-emitting layer shows a function of emitting light by receiving the holes which are injected from the first electrode 10 and transported through the hole transport layer and the electrons which are injected from the second electrode 11 and recombining the holes with the electrodes inside the light-emitting layer. The light-emitting layer may include a low-molecular light-emitting material or a polymer light-emitting material. If the light-emitting layer includes a low-molecular light-emitting material, such a layer can be formed by a method such as a vacuum evaporation method. If the light-emitting layer includes a polymer light-emitting material, such a layer can be formed by a wet-application method using an organic solvent, such as an ink-jet method and a spin-coating method. In this case, a high-accuracy organic EL display device with a large display region can be produced inexpensively through a few production steps. The material for the light-emitting layer is not especially limited as long as it contains an organic EL material. Examples thereof include poly(2-decyloxy-1,4-phenylene) (DO-PPP), poly[2,5-bis-[2-(N,N,N-triethylammonium)ethoxy]-1,4-phenyl-alt-1,4-phenylene]dibromide (PPP-$NEt^{3+}$), and poly[2-(2'-ethylhexyloxy)-5-methoxy-1,4-phenylenevinylene] (MED-PPV).

The second electrode 11 is preferably arranged to cover the light-emitting organic layer 12 and the barrier insulating layer 9, and has a function of injecting electrons into the light-emitting organic layer 12. The material for the second electrode 11 is not especially limited. However, in the top emission organic EL display device, light emitted from the light-emitting layer is transmitted through the second electrode 11 and then output. Therefore, it is more preferable that the second electrode 11 is made of a material with a high light transmittance such as indium tin oxide (ITO) and indium zinc oxide (IZO).

It is more preferable that the second electrode 11 is made of a material with a low work function, in order to attain a high efficiency of injecting electrons into the light-emitting organic layer 12. Calcium (Ca) and the like may be used, for example, as such a material which has a low work function and is suitable for the second electrode 11. The second electrode 11 may be formed by a metal layer made of calcium (Ca) and the like, having a low work function, and a metal layer made of aluminum (Al) and the like, having a low resistance. Alternatively, the second electrode 11 may be formed by a metal layer made of calcium (Ca) and the like, having a low work function and a transparent electrode layer made of indium tin oxide (ITO) and the like, having a higher light transmittance. According to such a configuration, the second electrode 11 can attain a high electron-injecting efficiency and a high light transmittance simultaneously, and therefore a top emission organic EL display device which permits a high luminance can be provided. The second electrode 11 may be formed by an ultrathin film made of a metal and the like.

The second electrode 11 is electrically connected to the TFT array board side through the off-pixel contact 3. According to the present preferred embodiment, the off-pixel contact 3 preferably is connected to the wiring 5 constituted by the third conductive layer, which is different from the first and second conductive layers. The wiring 5 electrically connects an external terminal for supplying an electric signal and/or an electric power from an external circuit to the off-pixel contact 3. That is, the second electrode 11 is electrically connected to the external circuit through the off-pixel contact 3, the wiring 5, and the external terminal.

The first conductive layer or the second conductive layer constituting the TFT 17, the driver circuit 19, and the signal line 4, has been widely used as the wiring 5 for connecting the off-pixel contact 3 to the external terminal 8, conventionally. However, in such a case, the wiring 5 cannot be formed in the driver circuit 19 region. That is, the driver circuit 19 includes a plurality of the TFTs 17 constituted by the first and second conductive layers, and a plurality of the wirings constituted by the first conductive layer for connecting the TFTs to each other and the second conductive layer. Therefore, it is difficult to form the wiring 5 constituted by the first conductive layer and/or the second conductive layer inside the driver circuit 19. Accordingly, the wiring 5 needs to be formed on the outside of the driver circuit 19 region (in some cases, on the inside thereof), conventionally, as shown in FIG. 6. As a result, the frame region (region except for the pixel region) on the TFT array board is spread. If the number of the off-pixel contact 3 is small, the region where the wiring 5 is formed is small. However, if the number of the off-pixel contact 3 is large, the region becomes larger, which spreads the frame region on the TFT array board.

In the top emission organic EL display device as in the present preferred embodiment, a light-transmitting material is used for the second electrode 11. However, such a material often has a high sheet resistance, which increases the electric resistance of the second electrode 11. As a result, a voltage reduction may be generated at a portion of the second electrode 11, which may make it impossible to display uniform image. If an organic EL display device which permits a high luminance is provided, a voltage between the first electrode 10 and the second electrode 11 needs to be increased, and therefore voltage reduction which tends to be generated at a portion of the second electrode 11 in the top emission type is further increased. As a result, it is more difficult to display uniform images. In order to solve such uneven display, the off-pixel contact 3 between the second electrode and the wiring 5 needs to be disposed at a plurality of positions, as shown in FIG. 7. However, if the number of the off-pixel contact 3 is increased, the region where the wiring 5 is formed becomes larger, which spreads the frame region. The entire size of a display device having a larger frame region is larger, even if the pixel region is the same. Therefore, particularly in display devices needed for reduction in size such as a cellular phone, such increase in the entire size is a serious defect.

According to the present preferred embodiment, the wiring 5 for connecting the off-pixel contact 3 to the external terminal 8 is formed in the driver circuit 19 region by using the third conductive layer, as shown in FIG. 1, and thereby the frame region can be reduced. The wiring 5 is formed in the same layer (the third conductive layer) as the layer where the first electrode 10 is formed, and is different from the first and second conductive layers used for forming the TFTs 17 in the driver circuit 19 and connecting the TFTs 17 to each other. Therefore, the wiring 5 is not in contact with the plurality of the TFTs 17 or the wirings for connecting the TFTs 17 to each other. As shown in FIGS. 1 and 3, the wiring 5 constituted by the third conductive layer can be formed to cover the TFTs 17 constituting the driver circuit 19. Therefore, the frame region can be reduced. Therefore, even if the number of the off-pixel contact 3 is increased to improve the uneven display, the frame region is not increased. That is, a display device which displays uniform image at a high luminance and has a small frame region can be provided. The off-pixel contact 3 needs to be disposed at least at one position on the board. It is particularly preferable that the off-pixel contact 3 is formed at a plurality of positions on the board. For example, as shown in FIG. 1, the off-pixel contact 3 can be formed at positions corresponding to four corners of the pixel region 1. Further, a relatively large off-pixel contact may be formed along the side of the pixel region. In this case, the off-pixel contacts may be formed along all of the four sides of the pixel region, or may be formed along any three, two or one side.

The off-pixel contact 3 connects the third conductive layer to the second electrode 11, which are above the first conductive layer and the second conductive layer. Therefore, there is no need to connect the third conductive layer to the second electrode 11 with a thick flattening film therebetween, as in the conventional connection between the second electrode and the first conductive layer, or the connection between the second electrode and the second conductive layer. Therefore, the third conductive layer can be more reliably connected to the second electrode 11. Further, the off-pixel contact 3 connects the third conductive layer to the second electrode 11, which are above the first conductive layer and the second conductive layer. Therefore, the off-pixel contact 3 itself can be formed above the driver circuit 19 region, and design freedom can be enhanced.

The material for the third conductive layer is not limited. Examples of such a material include: electrode materials, such as metal materials with a high electrical conductivity such as silver (Ag), aluminum (Al), copper (Cu), tantalum (Ta), titanium (Ti), and chromium (Cr), and conductive oxides such as indium tin oxide (ITO) and indium zinc oxide (IZO); and stacking layers thereof. It is preferable that the first electrode 10 is constituted by the third conductive layer, as in the present preferred embodiment. As a result, the first electrode 10, and the wiring 5 constituted by the third conductive layer can be formed in the same production step using the same photomask, and therefore such a display device can be produced inexpensively without increase in the production steps.

The second electrode 11 is electrically connected to the TFT array board side in the off-pixel contact 3. According to the present preferred embodiment, in the off-pixel contact 3, the second electrode 11 is connected to the wiring 5 constituted by the third conductive layer different from the first and second conductive layers. The wiring 5 electrically connects the external terminal 8 for which an electric signal and/or an electric power from the external circuit are/is supplied, to the off-pixel contact 3. That is, the second electrode 11 is electrically connected to the external circuit, through the off-pixel contact 3, the wiring 5, and the external terminal 8. In this case, the second electrode 11 is formed to cover the light-emitting organic layer 12, but the shape thereof is not limited as long as the second electrode 11 covers the light-emitting organic layer 12 and the off-pixel contact. For example, the second electrode 11 may be formed so as not to cover the driver circuit 19, or may be formed to cover the entire driver circuit 19 or a portion thereof. The second electrode 11 is not necessarily formed to be one common electrode, and may be divided into two or more portions. In the present preferred embodiment, of the electrodes interposing the light-emitting organic layer 12, the electrode on the board side is mentioned as an anode electrode which injects holes and the other electrode as a cathode electrode which injects electrons. However, the present invention is not limited to this configuration. For example, a configuration in which the electrode on the board side is a cathode electrode and the other electrode is an anode electrode may be adopted.

The production method of the light-emitting circuit board used in the organic EL display device in the present preferred embodiment is described below.

First, the island semiconductor layer 15, the gate insulator 18, the gate electrode 14 constituted by the first conductive layer, the source/drain electrodes 16 constituted by the second conductive layer, and the like are formed on the insulating board 2. Then, the TFTs 17 in the pixel region 1 and the driver circuit 19 are prepared, and then the flattening film 13 is formed. Methods for forming these components are not especially limited.

Then, on the flattening film 13, a conductive material such as aluminum (Al) is formed by a sputtering method and the like and patterned to have a desired shape by a photolithography method. As a result, the first electrode 10 constituted by the third conductive layer is formed. Simultaneously, the wiring 5 for connecting the off-pixel contact 3 to the external terminal 8 is formed. It is preferable that the surface of the first electrode 10 is provided with lyophilicity by UV/O$_3$ treatment (UV/ozone treatment) if the light-emitting organic layer 12 is formed by a wet-application method using an organic solvent such as an ink-jet method and a spin-coating method. As a result, affinity between the first electrode 10 and the light-emitting organic layer 12 is improved, and therefore the light-emitting organic layer 12 can be more uniformly formed.

Then, the insulating film 21 is formed over a plurality of the first electrodes 10. An insulating material such as SiO$_2$ is formed and patterned by a photolithography method in such a way that the insulating film 21 is provided with an opening only at a light-emitting portion on each of the first electrodes 10. As a result, electrical leakage at ends of the first electrode 10 or near the barrier insulating layer 9 can be prevented.

Then, the barrier insulating layer 9 is formed on the first electrode 10. The method of forming the barrier insulating layer 9 is not especially limited, but may be formed by: patterning a thin film such as a photosensitive polyimide film formed by a spin-coating method, into a desired shape through a series of photoresist steps including photoresist application, pre-baking, exposure, development, post-baking, etching, and photoresist stripping. It is preferable that the barrier insulating layer 9 is made of a material into which an additive such as fluorine and silicon is doped and then provided with lyophobicity if the light-emitting layer 12 is formed by a wet-application method using an organic solvent such as an ink-jet method and a spin-coating method. It is more preferable that the surface of the barrier insulating layer 9 is provided with lyophobicity by oxygen plasma treatment, carbon tetrafluoride plasma treatment, and the like. As a result, an ink droplet including a material for the light-emitting organic layer 12 can be effectively prevented from being landed at an inappropriate position.

Then, the light-emitting organic layer 12 is formed by forming a hole transport layer and a light-emitting layer by an ink jet method, a spin-coating method, a vacuum deposition method, and the like, on each of the first electrodes 10 partitioned in a matrix pattern by the barrier insulating layers 9. The light-emitting organic layer 12 can be formed inexpensively through a few production steps by being formed by a wet-application method such as an ink-jet method and a spin-coating method.

Finally, the second electrode 11 is preferably formed to cover the entire light-emitting organic layer 12, and thereby a light-emitting circuit board used in organic EL display devices is completed. The method of forming the second electrode 11 is not limited, and may be formed by a sputtering method. The light-emitting circuit board produced by the above-mentioned method can display uniform images at a high luminance and have a small frame region. Further, such a board can be produced inexpensively without increase in the production steps.

This Non-provisional application claims priority under 35 U.S.C. §119 to Patent Application No. 2005-152953 filed in Japan on May 25, 2005, the entire contents of which are hereby incorporated by reference.

The term "or more" used in the present application includes the value described.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A light-emitting circuit board comprising:
    a board;
    a plurality of pixels disposed on the board and each including a first electrode, a light-emitting layer, and a second electrode, stacked in this order;
    a driver circuit; and
    an external terminal; wherein
    the driver circuit is connected to the external terminal;
    the second electrode of each pixel and the external terminal are connected to each other by a wiring through a plurality of off-pixel contacts;
    the wiring is arranged to overlap with at least a portion of the driver circuit; and
    the plurality of off-pixel contacts are located at positions corresponding to four corners of a rectangular pixel region on the board.

2. The light-emitting circuit board according to claim 1, wherein the second electrode is made of a light-transmitting material.

3. The light-emitting circuit board according to claim 1, wherein the wiring is disposed in a layer including the first electrode.

4. The light-emitting circuit board according to claim 1, wherein
    each of the driver circuit and the pixel includes a thin film transistor including a gate electrode defined by a first conductive layer, and source and drain electrodes defined by a second conductive layer;
    a signal line arranged to connect the thin film transistor inside the pixel to the driver circuit is defined by the first conductive layer and/or the second conductive layer; and the wiring is defined by a third conductive layer.

5. The light-emitting circuit board according to claim 4, wherein a signal line arranged to connect the source electrode of the thin film transistor to the driver circuit is defined by the second conductive layer.

6. The light-emitting circuit board according to claim 1, wherein the off-pixel contact is located at a plurality of positions on the board.

7. The light-emitting circuit board according to claim 1, wherein the light-emitting layer includes an organic electroluminescent material.

8. A light-emitting display device comprising the light-emitting circuit board of claim 1.

* * * * *